(12) United States Patent
Hatano

(10) Patent No.: US 6,233,023 B1
(45) Date of Patent: May 15, 2001

(54) AUTOMATIC FINE TUNING CIRCUIT

(75) Inventor: Hiroyuki Hatano, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 08/855,618

(22) Filed: May 13, 1997

(30) Foreign Application Priority Data

May 15, 1996 (JP) .................................................. 8-119857

(51) Int. Cl.[7] .................................................. H04N 5/50
(52) U.S. Cl. ........................ 348/731; 348/733; 455/182.3
(58) Field of Search .................... 348/731, 732, 348/733; 455/182.1, 182.2, 182.3, 192.1, 192.2, 192.3, 260, 266, 170.3, 173.1, 179.1, 180.3; 331/25; H04N 5/50

(56) References Cited

U.S. PATENT DOCUMENTS

| | | | |
|---|---|---|---|
| 4,100,578 | * 7/1978 | Arneson | 358/191 |
| 4,146,843 | * 3/1979 | Isobe | 329/50 |
| 4,271,433 | * 6/1981 | Theriault | 358/188 |
| 4,271,434 | * 6/1981 | Sakamoto | 348/731 |
| 4,503,465 | * 3/1985 | Wine | 358/195.1 |

* cited by examiner

Primary Examiner—Michael Lee
(74) Attorney, Agent, or Firm—Arent Fox Kintner Plotkin & Kahn, PLLC (57) ABSTRACT

An AFT circuit achieves automatic fine tuning by use of an AFT voltage obtained by a F/V converter through its F/V conversion of an output from a VCO that is controlled by a PLL circuit to operate in synchronism with a video carrier included in a television signal supplied from outside. The center frequency of the VCO is shifted by adding the AFT voltage to an output signal from the phase comparator of the PLL circuit in order to obtain a wider capture range for automatic fine tuning.

11 Claims, 8 Drawing Sheets

AUTOMATIC FINE TUNING CIRCUIT

BACKGROUND OF THE INVENTION

1. Field of the Invention

The present invention relates to an AFT (automatic fine tuning) circuit for use in television receivers, videocassette recorders, and similar appliances.

2. Description of the Prior Art

AFT circuits are used to control the local oscillation frequency of a tuner so that a correct video intermediate frequency carrier (58.75 MHz in Japan) is obtained. They are also used to achieve tuning (automatic channel search and channel presetting) in cooperation with a horizontal synchronization detection signal or other.

Conventionally, automatic fine tuning is achieved by the use of an AFT signal generated by a frequency discriminator provided exclusively for this purpose. In recent years, automatic frequency tuning has come to be achieved more and more by the use of an AFT voltage that is obtained as a result of direct F/V (frequency-to-voltage) conversion of the output of a VCO (voltage-controlled oscillator) responsible for the generation of the video intermediate frequency carrier.

Figure 8:
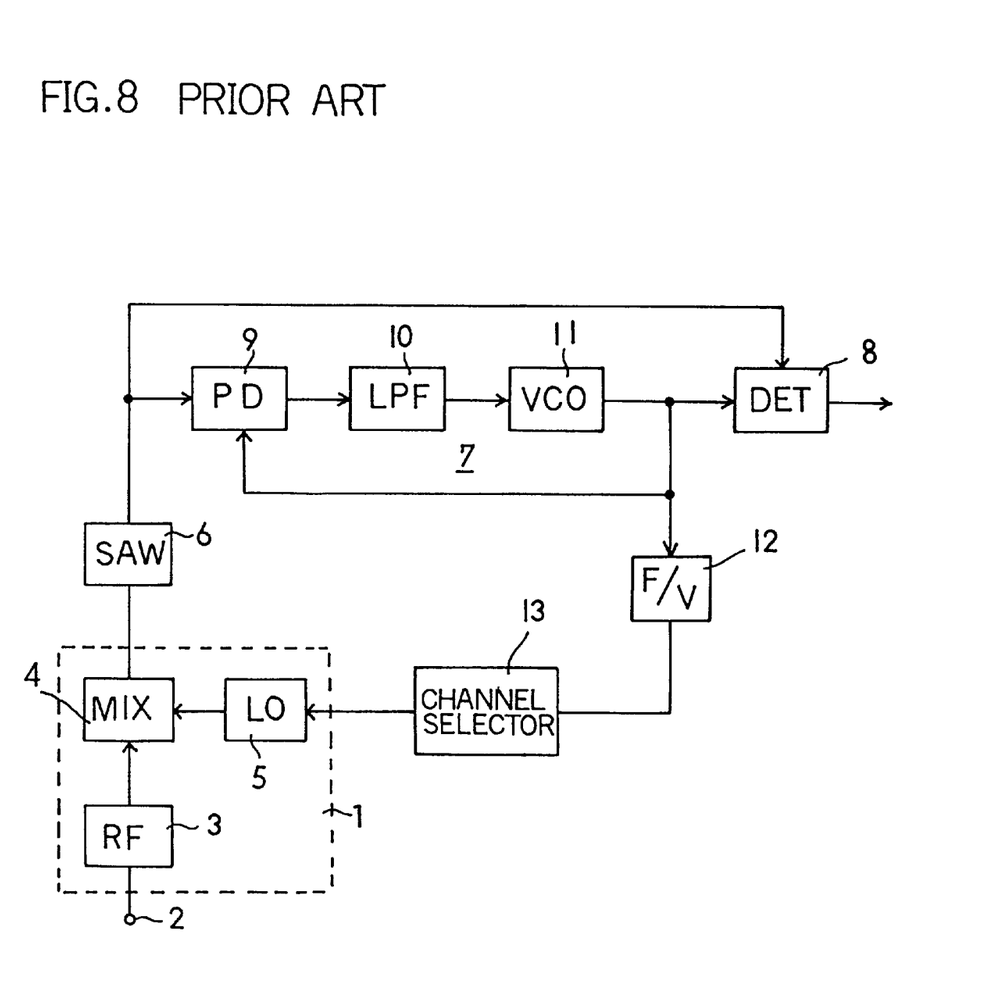
FIG. 8 is a block diagram of a conventional AFT circuit.

FIG. 8 shows an example of a conventional AFT circuit of the more recent type. In FIG. 8, numeral 1 represents a tuner consisting of an RF circuit 3 for amplifying an RF (radio frequency) signal received via an input terminal 2, a mixer 4, and a local oscillator 5. The output of the tuner 1 is transmitted through a SAW (surface acoustic wave) filter 6 to a video processing circuit.

The video processing circuit consists of a PLL (phase-locked loop) circuit 7 for generating a video carrier, and a video detector 8. The PLL circuit 7 includes a VCO 11, a phase comparator 9 for comparing the phases between the output of the VCO 11 and the VIF (video intermediate frequency) carrier of the received signal, and a low-pass filter 10 for smoothing the comparison output from the phase comparator 9. The video detector 8 not only detects a video signal, but also separates an intercarrier audio signal having a 4.5 MHz carrier.

The output of the VCO 11 is converted by a F/V converter 12 into a voltage, and this voltage is supplied as an AFT voltage to a channel selector 13 provided with a tuning microcomputer or frequency synthesizer. The channel selector 13 also receives an output from a horizontal synchronization detection circuit (not shown) via a separate route.

Figure 9:
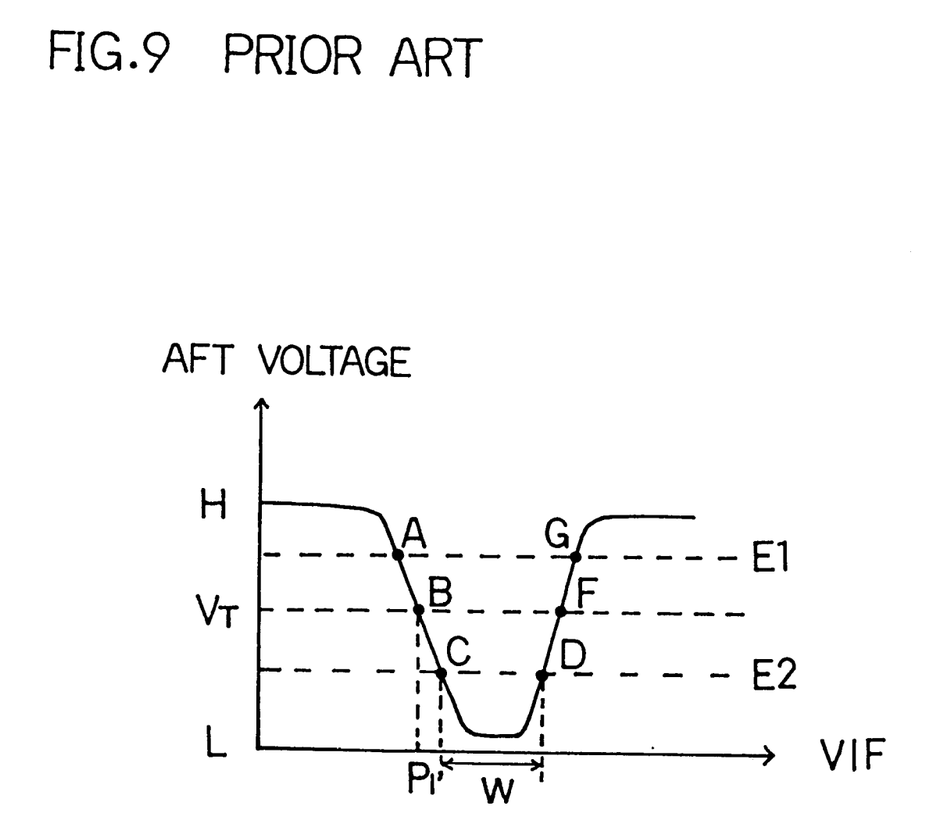
FIG. 9 is a diagram showing the AFT voltage characteristic of the conventional AFT circuit.

The AFT voltage varies with the VIF frequency as shown in FIG. 9. In FIG. 9, the point B indicates the frequency $P_1$ (58.75 MHz) at which the VIF frequency should ideally be locked. In reality, however, it is locked within the range between the point A and the point C. E1 and E2 represent threshold voltages for the channel selector 13. When the AFT voltage is below the threshold voltage E2, the channel selector 13 controls the local oscillator 5 so that the AFT voltage (hence the oscillation frequency of the local oscillator 5) is varied in smaller increments or decrements than usual.

The high level of the AFT voltage is set to be equal to the source voltage $V_{CC}$, and the point B is set to be at the voltage of $V_{CC}/2$. In FIG. 9, the range W where the AFT voltage is at its low level, i.e. below E2, corresponds to the capture range of the PLL.

When the VIF frequency approaches the ideal frequency from below the point A, it first increases over the point C into the capture range W, and then returns toward the point B, since the slope between the points A and C is steep.

Similarly, when the VIF frequency approaches the ideal frequency from above the point G, it first decreases below the point D into the capture range W, and then moves toward the point B.

However, this conventional method, which uses an AFT voltage obtained through F/V conversion of the output of the VCO 11 of the PLL circuit, is defective, because it sometimes allows the VIF frequency to be locked erroneously at the frequency of the audio signal.

Figure 4:
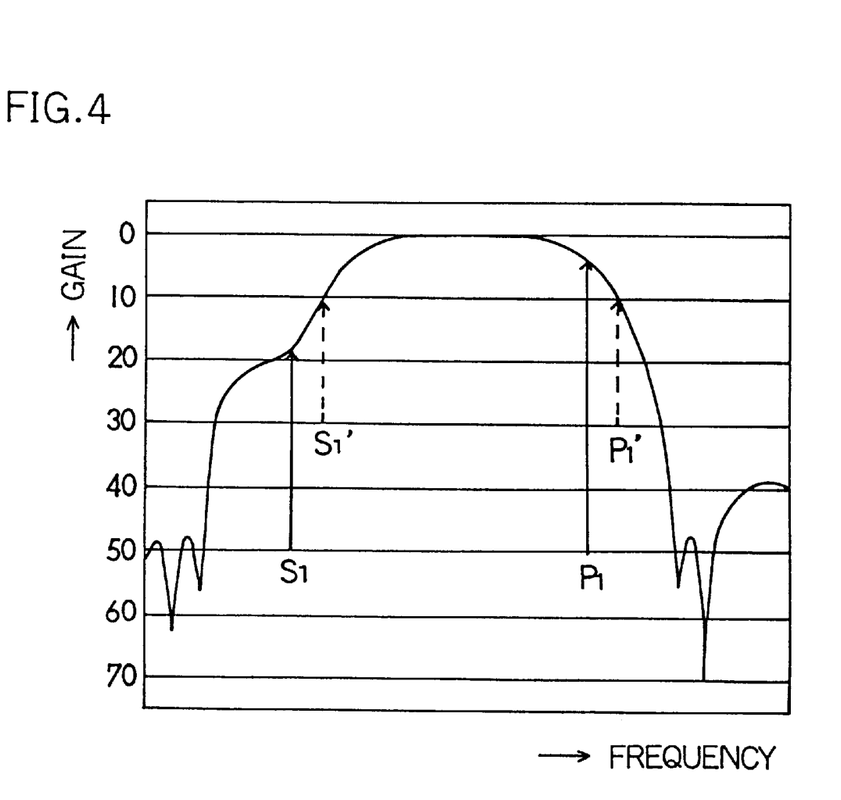
FIG. 4 is a diagram showing the characteristic of the SAW filter.

For example, assume that, as a result of a tuning operation, the VIF frequency is now approaching the ideal frequency from a frequency higher than it (that is, the frequency of the local oscillation signal is now decreasing). As shown in FIG. 4, the SAW filter 6 is designed to exhibit approximately the same gain (level) at two frequencies $P_1'$ and $S_1'$, which are respectively 500 kHz higher than the frequencies of the video carrier $P_1$ (58.75 MHz) and the audio carrier $S_1$ (54.25 MHz).

Figure 7:
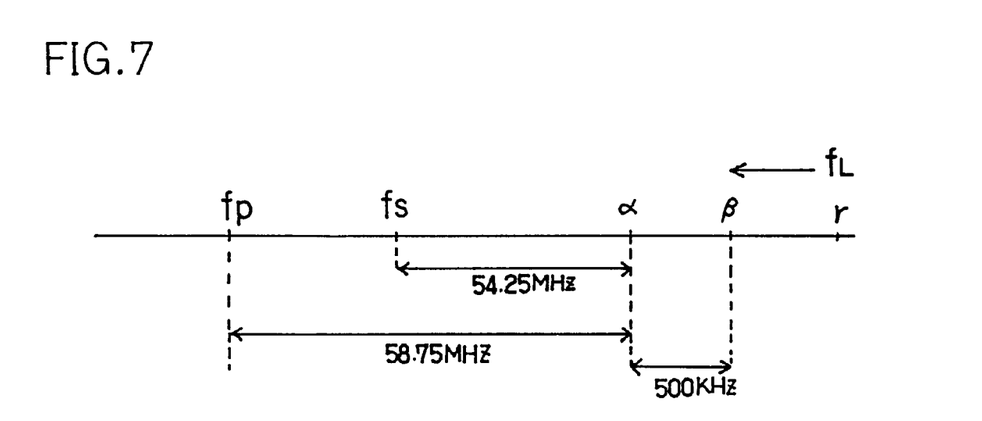
FIG. 7 is a diagram explaining the correlation between the local oscillation frequency of the tuner and the video and audio carriers included in the RF signal.

Moreover, the SAW filter 6 exhibits a steep drop in its gain for frequencies higher than $P_1'$, and exhibits a rise in its gain for frequencies higher than $S_1'$. Accordingly, when the local oscillation frequency $f_L$, decreasing from a higher frequency, comes close to the frequency γ in FIG. 7, the SAW filter 6 exhibits a high gain for the frequency $f_L-f_S$, whereas it exhibits only a slight gain for the frequency $f_L-f_P$. In FIG. 7, $f_P$ represents the frequency of the video carrier included in the RF signal, and $f_S$ represents the frequency of the audio carrier included in the RF signal; α represents the frequency at which $f_L$ is to be tuned, and β represents the frequency at which $f_L$ causes the carriers to have the frequencies $P_1'$ and $S_1'$.

As a result, the phase comparator 9 receives a signal having the frequency $f_L-f_S$, compares this signal with the output (having a frequency of approximately 58.75 MHz) from the VCO 11, and causes the VCO 11 to be controlled in accordance with such comparison. Thus, the VCO 11 is locked at the frequency $f_L-f_S$ as soon as this frequency comes within the pulling range (±1.5 MHz around the center frequency) of the VCO 11. Obviously, this is an unwanted result.

Even when the VIF signal is tuned from a frequency lower than the ideal frequency, there is a possibility that the capture range W, if it is not wide enough, is skipped and thus a similar unwanted result is caused. It is possible to avoid this problem by varying the frequency in even smaller increments and decrements within the capture range W. However, this increases the time required to achieve tuning.

SUMMARY OF THE INVENTION

An object of the present invention is to provide an AFT circuit that allows quick and accurate tuning despite the use of an AFT voltage obtained through F/V conversion of the output of a PLL circuit.

To achieve the above object, according to the present invention, an AFT circuit performs automatic fine tuning by use of an AFT voltage obtained through F/V conversion of an output from a VCO that is controlled by a PLL circuit to operate in synchronism with a video carrier included in a television signal supplied from outside. In this circuit, the center frequency of the VCO is shifted by adding the AFT voltage to a phase-comparison output signal in the PLL circuit in order to obtain a wider capture range for automatic fine tuning.

The AFT circuit according to the present invention is provided with a tuner; a SAW filter for filtering an intermediate-frequency signal outputted from the tuner; a PLL circuit including a VCO whose oscillation frequency is controlled by the PLL circuit in accordance with an output from the SAW filter; a video detector for extracting a video signal from the intermediate-frequency signal by multiplying the intermediate-frequency signal having passed through the SAW filter by an oscillation signal from the VCO; an AFT voltage generating circuit that converts the oscillation frequency of the VCO into a voltage that is used as an AFT voltage to control a local oscillation frequency of the tuner; and supplying means for supplying the AFT voltage from the AFT voltage generating circuit to the PLL circuit as a control voltage for controlling the VCO.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
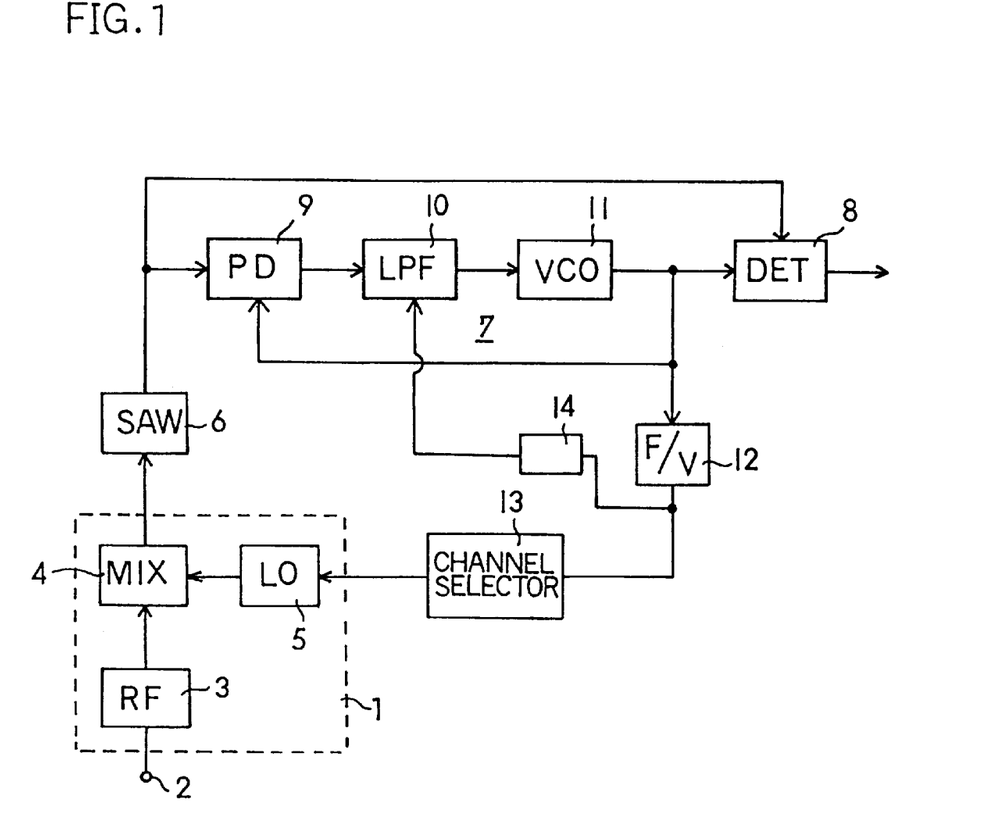
FIG. 1 is a block diagram of an AFT circuit embodying the present invention.

Hereinafter, embodiments of the present invention will be described with reference to the drawings. In the following descriptions, such components as are found in the conventional AFT circuit in FIG. 8 will be identified with the same designations, and overlapping descriptions will not be repeated. FIG. 1 shows the AFT circuit of a first embodiment of the present invention. In this embodiment, the output voltage of the F/V converter 12 is applied to the low-pass filter 10 through a feedback circuit 14.

Figure 2:
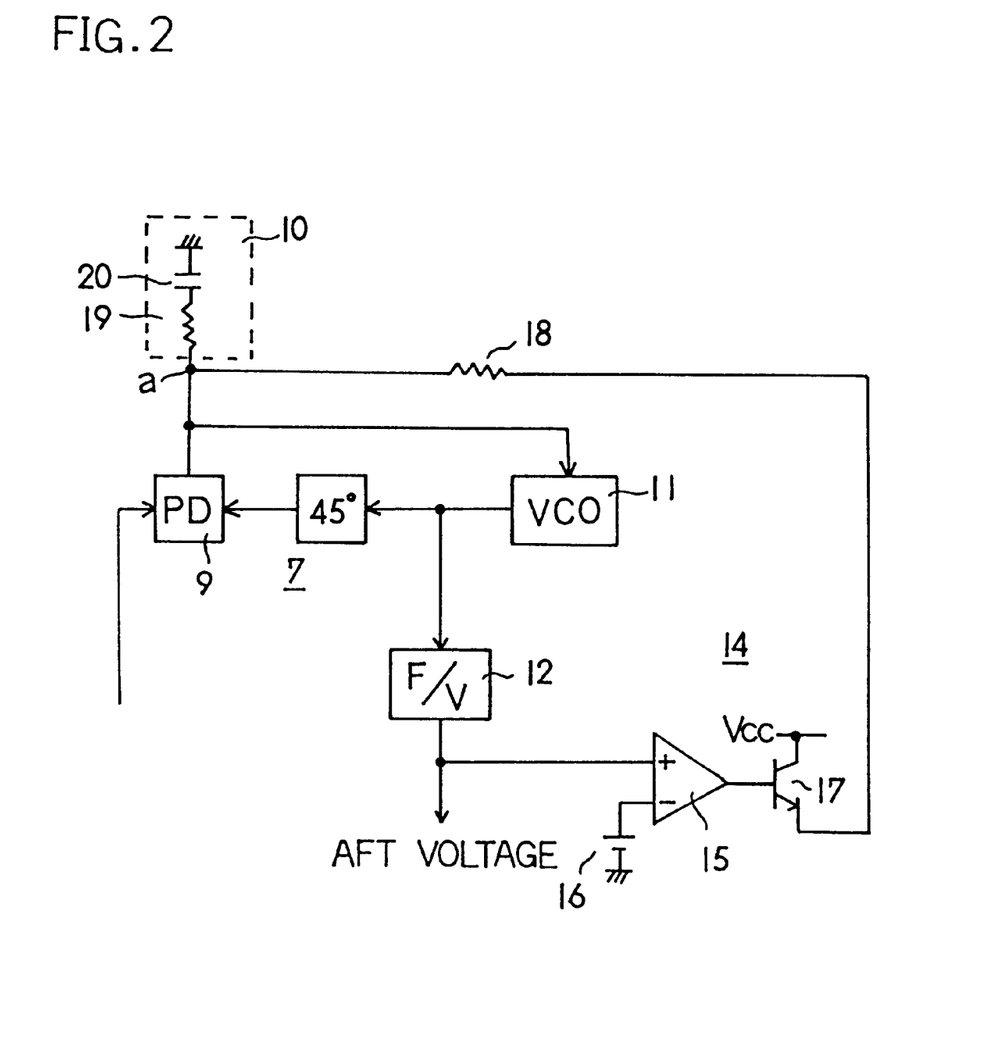
FIG. 2 is a circuit diagram of the principal portion of the AFT circuit of a first embodiment of the present invention.

Specifically, as shown in FIG. 2, the feedback circuit 14 consists of a comparator 15, an npn-type transistor 17, and a resistor 18, and supplies its output to a node a between the phase comparator 9 and the low-pass filter 10. In the low-pass filter 10, the output voltage of the feedback circuit 14, supplied via the node a, is added to the output voltage of the phase comparator 9. The low-pass filter 10 consists of a resistor 19 and a capacitor 20.

A direct-current voltage source 16 supplies a reference voltage to the inverting terminal (−) of the comparator 15. The reference voltage is set, for example, to a voltage $V_T$ shown in FIG. 3. An AFT voltage is output from the F/V converter 12, and is supplied to the non-inverting terminal (+) of the comparator 15. When the AFT voltage exceeds the reference voltage, the comparator 15 outputs a high-level voltage. This causes the transistor 7 to be turned on, so that the voltage $V_{CC}$ of the power source is applied to the node a. Here, the PLL circuit 7 is designed to raise the oscillation frequency of the VCO 11 as the voltage at the node a rises. As a result, as the AFT voltage rises, the oscillation frequency of the VCO 11 shifts upward.

Figure 3:
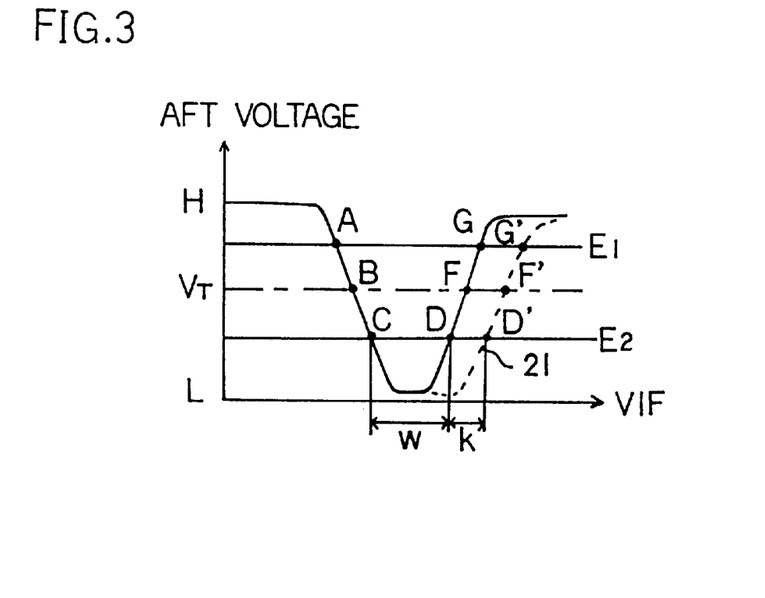
FIG. 3 is a diagram showing the AFT voltage characteristic of the first embodiment.

As shown in FIG. 3, as the oscillation frequency of the VCO 11 shifts upward, the AFT voltage curve also shifts upward, that is, to the right in the figure, as indicated by the dotted line 21. Thus, the capture range, which is a range in which the AFT voltage is held lower than the threshold voltage E2 of the channel selector, comes to have a larger width W+K than its original width W.

While tuning is being performed in such a way that the VIF frequency approaches the ideal frequency from a frequency higher than it, the frequencies of the VIF video carrier and the VIF audio carrier are both higher than they should be. As a result, the SAW filter 6 exhibits, as described earlier, almost no gain for the VIF video carrier and a high gain for the VIF audio carrier, and thus only the VIF audio carrier is supplied to the phase comparator 9.

Then, just as the VCO 11 is about to be affected by the VIF audio carrier (i.e. locked at the frequency thereof), a rise in the AFT voltage activates the feedback circuit 14, and causes the center frequency of VCO 11, together with its pulling range (±0.5 MHz around the center frequency, for example), to shift upward. This prevents the frequency $f_L-f_S$ from coming into the pulling range of the VCO 11, and thus prevents the VCO 11 from being locked at the frequency of the audio carrier. On the other hand, since $f_L-f_P$ has a frequency 4.5 MHz higher than $f_L-f_S$ at this moment, the former is well within the pulling range even when the center frequency of the VCO 11 is shifted upward, and accordingly it affects automatic fine tuning even if the SAW filter exhibits an extremely low gain for it. Thus, automatic fine tuning is achieved in accordance with the video carrier.

Moreover, since the AFT voltage curve is also shifted as indicated by the dotted line 21 in FIG. 3 in a tuning operation performed such that the VIF frequency approaches the ideal frequency from a higher frequency, the AFT voltage, in its transition to a target voltage, first reduces, tracing the points G', F', and D', into the capture range (W+K), and then rises toward the point B in smaller increments until tuning is accomplished.

As described above, according to the present invention, it is possible to obtain a wider capture range, and accordingly, even if tuning is performed by varying a frequency in coarser increments or decrements within the capture range than in conventional AFT circuits, the capture range is never skipped. Moreover, coarser increments or decrements of a frequency helps achieve tuning quickly.

Figure 5:
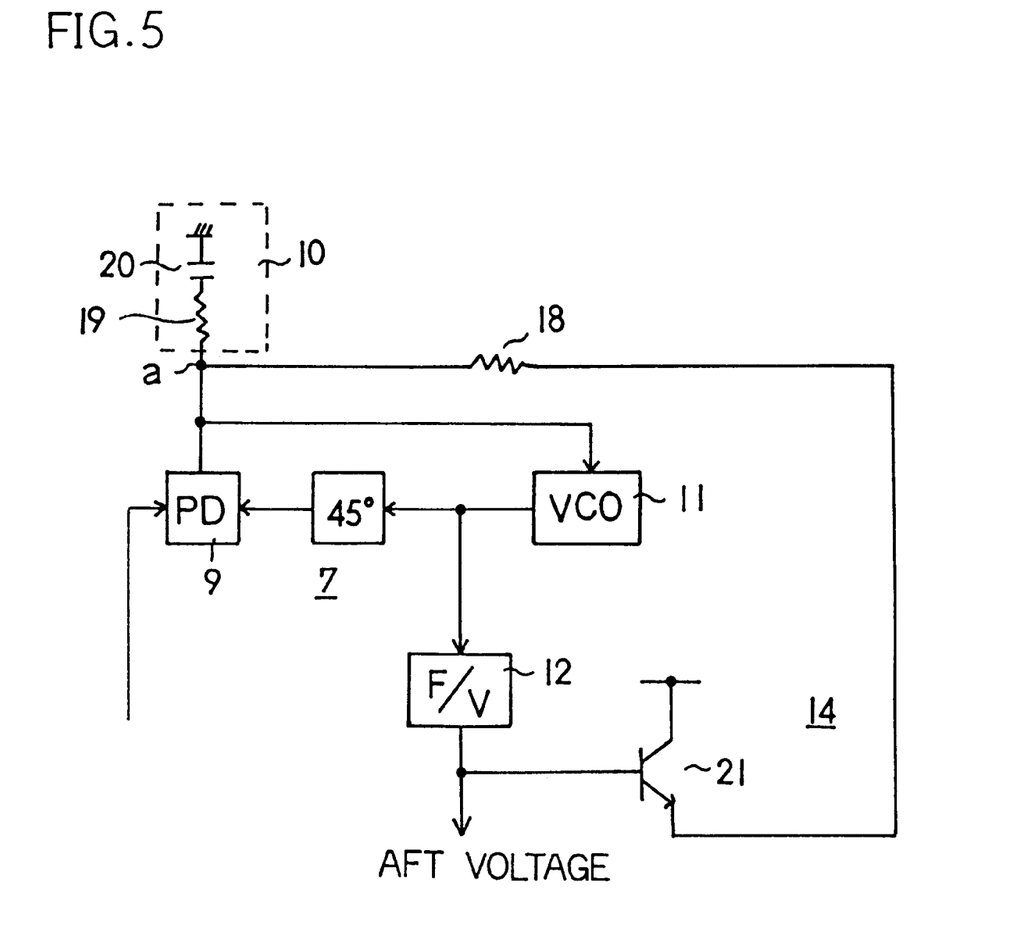
FIG. 5 is a circuit diagram of the principal portion of the AFT circuit of a second embodiment of the present invention.

FIG. 5 shows the AFT circuit of a second embodiment of the present invention. In the second embodiment, instead of using the comparator 15 in FIG. 2, the AFT voltage is applied directly to the base of a transistor 21. This transistor 21 is turned on when the AFT voltage becomes higher than its emitter voltage by a voltage $V_F$ (the base-emitter conducting voltage of the transistor 21). In other words, when the transistor 21 is on, a voltage lower than the AFT voltage by the voltage $V_F$ is applied to the node a. Here, since $V_F$ may be a conducting voltage of any pn-junction, a diode may be used instead of the transistor 21. That is, the transistor 21 or the diode (not shown) here can be termed a pn-junction semiconductor device.

Figure 6:
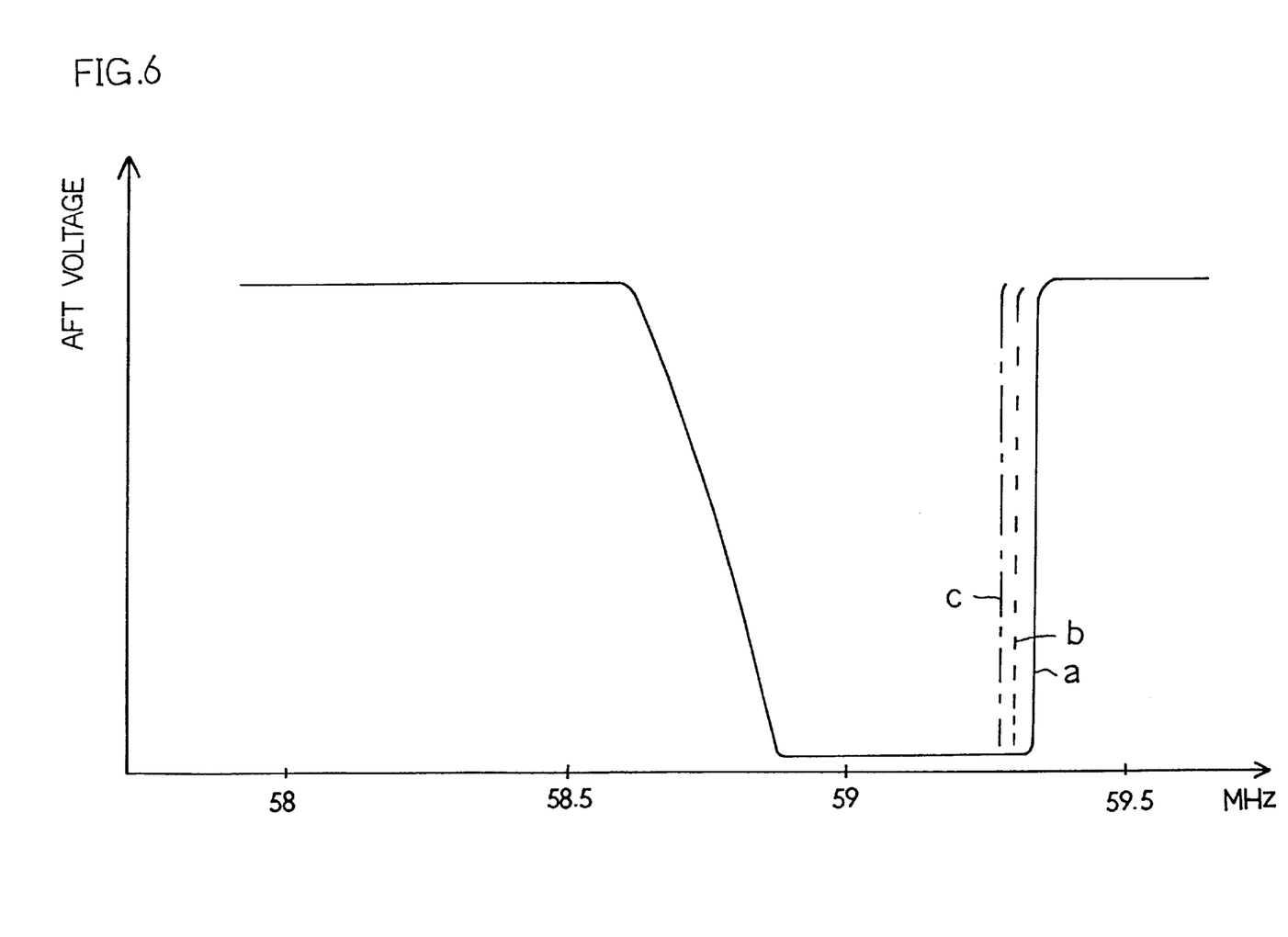
FIG. 6 is a diagram explaining the AFT voltage characteristic of the second embodiment.

In other respects, the AFT circuit of FIG. 5 has the same construction as that of FIG. 2. As shown in FIG. 6 (in which the VIF frequency is taken along the horizontal axis and the AFT voltage is taken along the vertical axis), the AFT voltage curve can be controlled to a certain degree by varying the resistance of a resistor 18 in FIG. 5. Specifically, as the resistance of the resistor 18 is increased, part of the AFT voltage curve shifts from a to b, and then to c. Such control of the AFT voltage curve is possible also in the AFT circuit of FIG. 3. In this way, it is possible, by varying the resistance of the resistor 18, to set how much the AFT voltage curve (thus the capture range) is to be shifted.

As described above, according to the present invention, it is possible to prevent failure of tuning under the influence of an audio signal. Moreover, it is possible to obtain a wider capture range for the AFT output voltage, and thus to realize a stable tuning system.

What is claimed is:

1. An automatic fine tuning circuit for achieving automatic fine tuning by use of an automatic fine tuning voltage obtained through frequency-to-voltage conversion of an output from a voltage-controlled oscillator that is controlled by a phase-locked loop circuit to operate in synchronism with a video carrier included in a television signal supplied from outside, wherein a center frequency of the voltage-controlled oscillator is shifted toward a higher-frequency side by adding the automatic fine tuning voltage to a phase-comparison output signal in the phase-locked loop circuit in order to obtain a wider capture range for automatic fine tuning.

2. An automatic fine tuning circuit as claimed in claim 1, wherein the automatic fine tuning voltage is added to the phase-comparison output signal when the automatic fine tuning voltage exceeds a predetermined voltage.

3. An automatic fine tuning circuit as claimed in claim 1, wherein the automatic fine tuning voltage is compared with the predetermined voltage by a comparator, and an output from the comparator is supplied through a resistor to a low-pass filter of the phase-locked loop circuit.

4. An automatic fine tuning circuit as claimed in claim 1, wherein the automatic fine tuning voltage is supplied through a pn-junction semiconductor device to a low-pass filter of the phase-locked loop circuit.

5. An automatic fine tuning circuit for use in a television signal processing device, comprising:

a tuner;

a surface-acoustic-wave filter for filtering an intermediate-frequency signal output from the tuner;

a phase-locked loop circuit including a voltage-controlled oscillator whose oscillation frequency is controlled by the phase-locked loop circuit in accordance with an output from the surface-acoustic-wave filter;

a video detector for extracting a video signal from the intermediate-frequency signal by multiplying the intermediate-frequency signal having passed through the surface-acoustic-wave filter by an oscillation signal from the voltage-controlled oscillator;

an automatic fine tuning voltage generating circuit that converts the oscillation frequency of the voltage-controlled oscillator into a voltage that is used as an automatic fine tuning voltage to control a local oscillation frequency of the tuner; and supplying means for supplying a predetermined voltage to the phase-locked loop circuit as a control voltage for controlling the voltage-controlled oscillator when the automatic fine tuning voltage from the automatic fine tuning voltage generating circuit becomes higher than a reference voltage.

6. An automatic fine tuning circuit as claimed in claim 5, wherein said supplying means comprises a comparator for comparing the automatic fine tuning voltage with the reference voltage, and a switching transistor that is activated to output the predetermined voltage by an output that the comparator yields when the automatic fine tuning voltage exceeds the reference voltage.

7. An automatic fine tuning circuit as claimed in claim 5, wherein said supplying means comprises a switching transistor that is activated by the automatic fine tuning voltage to output the predetermined voltage lower than the automatic fine tuning voltage.

8. An automatic fine tuning circuit as claimed in claim 5, wherein said supplying means comprises a pn-junction semiconductor device that is activated by the automatic fine tuning voltage to output the predetermined voltage lower than the automatic fine tuning voltage.

9. An automatic fine tuning circuit as claimed in claim 5, wherein said phase-locked loop circuit comprises a phase comparator for comparing phases between the output from the surface-acoustic-wave filter and the oscillation signal of the voltage-controlled oscillator, and a low-pass filter for integrating an output from the phase comparator and supplying it to the voltage-controlled oscillator, and wherein the automatic fine tuning voltage is added to the output from the phase comparator in the low-pass filter.

10. An automatic fine tuning circuit as claimed in claim 9, wherein the automatic fine tuning voltage is supplied to the low-pass filter through a resistor.

11. An automatic fine tuning circuit as claimed in claim 5, wherein the surface-acoustic-wave filter exhibits increasing gains for frequencies higher than an audio intermediate frequency and exhibits decreasing gains for frequencies higher than a video intermediate frequency.

* * * * *